United States Patent [19]

Althouse

[11] Patent Number: 4,479,087

[45] Date of Patent: Oct. 23, 1984

[54] STANDING WAVE RATIO AND POWER METER

[76] Inventor: John E. Althouse, 1924F W. Mission Rd., Escondido, Calif. 92025

[21] Appl. No.: 370,770

[22] Filed: Apr. 22, 1982

[51] Int. Cl.³ .............................................. G01R 27/04
[52] U.S. Cl. ............................... 324/58 B; 324/140 D
[58] Field of Search ................... 324/99 D, 133, 58 B, 324/58 R, 58.5 B, 140 D, 132; 455/115; 340/753, 754; 381/56; 328/161

[56] References Cited

U.S. PATENT DOCUMENTS

| | | | |
|---|---|---|---|
| 3,704,409 | 11/1972 | Oomen | 324/58 B X |
| 4,110,685 | 8/1978 | Leenerts | 324/58 B |
| 4,249,258 | 2/1981 | Craven | 324/58 B X |
| 4,262,246 | 4/1981 | Fuji | 324/58 B X |
| 4,318,152 | 3/1982 | Weber | 324/133 X |

*Primary Examiner*—Stanley T. Krawczewicz
*Assistant Examiner*—Jose M. Solis
*Attorney, Agent, or Firm*—Charmasson & Holz

[57] ABSTRACT

An apparatus for measuring the Standing Wave Ratio and the RF transmitted power is in a transmission line. The ratio of the reflected component over the incident component of the transmitted signal is indicated on a logarithmic dot bar readout driven by the outputs of a stack of comparators. The comparators are separately referenced to a voltage divider ladder to which is applied a first DC voltage proportional to the incident component. The inputs of the comparator receive a second DC voltage signal proportional to the reflected component. The readout is provided with a scale directly indicating the Standard Wave Ratio. A similar circuit with linear readout referenced to a full scale voltage received the first DC voltage signal on its joint comparator inputs in order to display the power transmitted on the line.

10 Claims, 1 Drawing Figure

STANDING WAVE RATIO AND POWER METER

FIELD OF THE INVENTION

The present invention relates to instruments used in connection with Radio Frequency signal transmission and measurement; and more specifically for the measurement of the standing wave ratio on a transmission line

BACKGROUND OF THE INVENTION

So called "standing waves" appear on a transmission line which is not terminated in its characteristic impedance; i.e. when the power of an RF signal applied to the transmission line from a source (such as a transmitter) is not fully absorbed by the load (such as an antenna).

The reflected voltage has always a 180° degree lead over the reflected current. The vectorial sum of the incident and reflected voltage or current represent their r.m.s. value at any point along the line.

This phenomena is usually defined in terms of a "Standing Wave Ratio" (SWR) based upon the ratio of the reflected power over the transmitted power according to the formula:

$$SWR = \frac{1 + \sqrt{\frac{\text{Reflected Power}}{\text{Incident Power}}}}{1 - \sqrt{\frac{\text{Reflected Power}}{\text{Incident Power}}}}$$

Methods for the directional measurement of power on transmission lines are well known to those skilled in the art (see "An Inside Picture of Directional Wattmeters" by Warren B. Bruene, QST Magazine, April 1959 issued page 24).

In the prior art, Standing Wave Ratio meters required two totally independent measurements. The first measurement would yield only the reflected power; while the second yield only the transmitted power. Separate analog panel meters would display the two resulting measurements which had then to be correlated in order to obtain the power ratio necessary to compute the SWR. Another commonly employed method for SWR measurement consists in calibrating a meter to display a full-scale reading for the incident power then switching the meter to read the reflected power. This sequential method is based on the assumption, which is not always correct, that the signal on the transmission line remains constant throughout the two measurements. These instruments were relatively of simple design and inexpensive, since usually there is no requirement for high accuracy in the tuning of a transmission circuit.

Ratiometric techniques which would give a direct reading have seldom been employed in the past in the design of SWR meters due to the unwarranted cost increase and added complexity which they would entail.

The appearance on the market of low-cost large scale integrated circuit modules has opened new opportunities for the design of inexpensive yet more advanced SWR meters.

SUMMARY OF THE INVENTION

The present invention takes advantage of the inherent ratiometric character of a new integrated circuit mode (such as Model numbers 3914 and 3915 manufactured by the National Semiconductor Corporation) designed to drive a bar graph array, in order to provide a simple, inexpensive yet accurate standing wave metering apparatus.

The apparatus displays both the absolute value of the forward transmitted power and the ratio of the reflected power over the transmitted power, which yields a direct SWR reading by appropriate scaling of the display.

The principle object of this invention is to provide a simple and inexpensive meter capable of measuring and directly displaying the ratio of the reflected power over the transmitted power in a transmission line.

A further object of the invention is to adapt an integrated circuit module designed as a bar graph array driver to the ratiometric measurement and display of two DC voltages. Those and other objects are achieved through the preferred embodiment of the invention disclosed below.

DESCRIPTION OF THE PREFERRED EMBODIMENT

Figure 1:
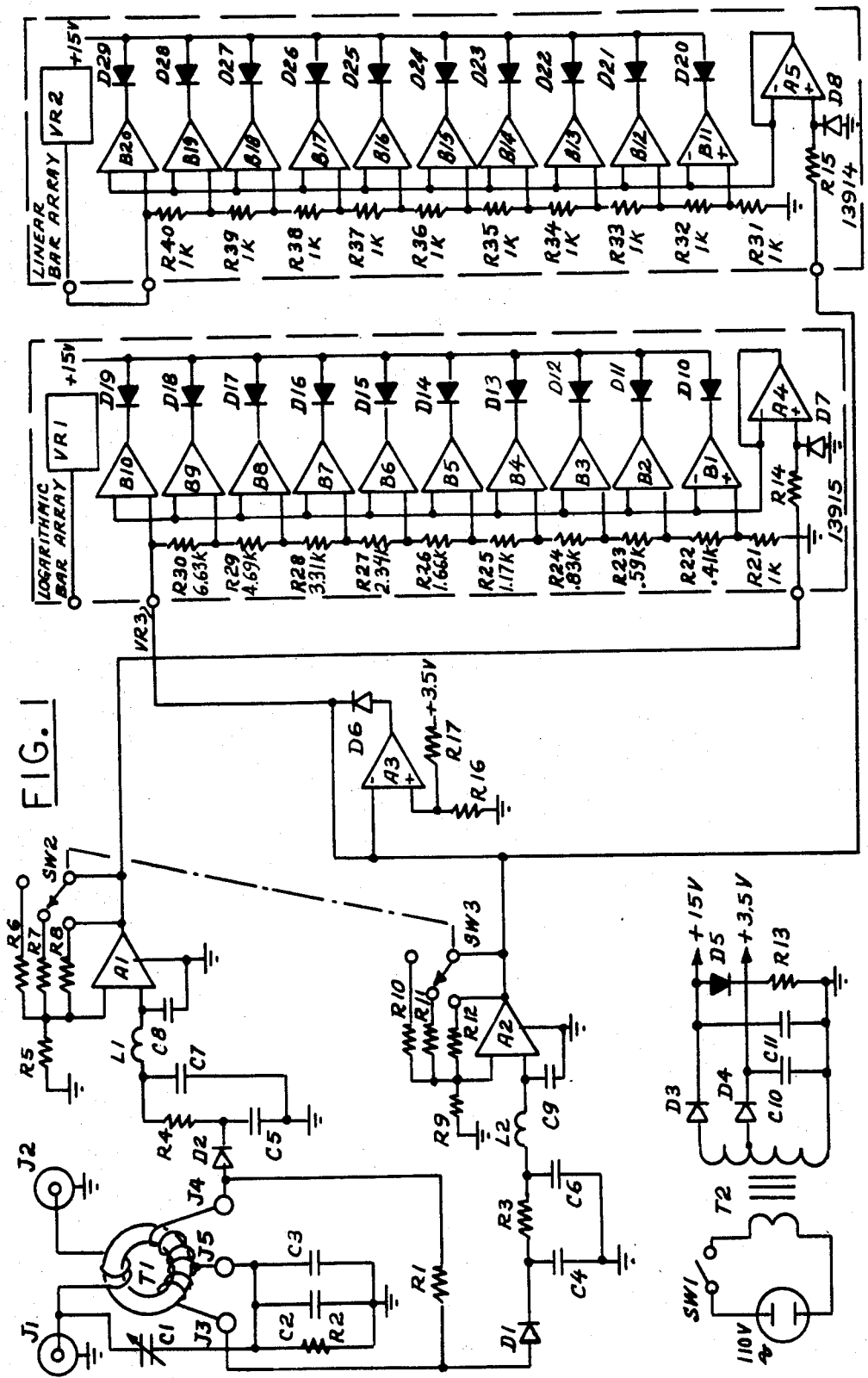
FIG. 1 is an electrical schematic of the Standing Wave Ratio and Power Meter.

Terminals J1 and J2 represent two coaxial connectors representing respectively the input and output of the Standing Wave Ratio Meter which is to be used in series with the transmission line. Conducter L1 between the two terminals J1 and J2 thus becomes part of the transmission line circuit and form the primary of a toroidal-core transformer T1; J1 being connected to the signal source and J2 being connected to the load or antenna. The transformer output voltage across terminal J3 and J4 is thus proportional to the RF current in the transmission line. With reference to the center tap on terminal J5 the outputs of J3 and J4 are equal but are 180° out of phase. An output voltage proportional to the RF voltage on the transmission line is provided across resistor R2 by the capacitive divider formed by capacitor C1 on one part and capacitors C2 and C3 on the other. This voltage is thus placed in series with both voltage outputs on terminals J3 and J4.

The forward power from source to load on the transmission line has its voltage and current components in phase. The reflected power from the load to the source, on the other hand, has its voltage and current 180° out-of-phase. Terminal J3 carries a signal which is proportional to the sum of the voltage and current on the transmission line. The amplitude of the voltage component can be adjusted by varying capacitor C1 until the two reflected components cancel due to their inherent phase difference. The remaining signal thus corresponds to the forward voltage and current components only. This signal is rectified by diode D1 and filtered before being applied to amplifier A2. On terminal J4, where the current components of the voltage differs by 180°, the forward components cancel and the resulting signal is the sum of the reflected voltage and current components. This signal is rectified by diode D2, filtered by C5, R4, C7 and L1 and then applied to the input of amplifier A1.

Amplifiers A1 and A2 are of similar design. They are provided with switchable gains of one, $\sqrt{10}$, and 10 which correspond to full-scale powers of 20, 200 and 2,000 watts. These are operational amplifiers which provide a very high input impedance allowing the selecting and filtering circuits described above to operate linearly at low power levels. The voltage at the output of A2, which is proportional to the forward power appearing on the transmission line, is applied to the common imputs of a stack of comparators B11-B20 by way of buffer amplifier A5. The reference terminals of the comparators are separately connected to a voltage divider ladder constituted by resistors R31-R40. A reference voltage VR2 corresponding to 9/10 of the maximum amplitude excursion of the output of amplifier A2 is applied to the voltage divider ladder. Resisters R31-R40 are of equal value and provide a series of scaled reference points above which the output of amplifier A2 must rise before triggering the respective comparators. The outputs of the comparators drive a bar graph array constituted by L.E.D. diodes D20-D29.

The bar graph array D20-29, the comparators B11-20, the voltage divider ladder R31-40, the voltage reference source VR2 and the buffer amplifier A5 can be implemented with a model 3914 large-scale integration graph array driver module.

The display of the ratio of the reflected component over the transmitted component of the transmission line signal is obtained by means of a similar circuit as the one just described and the bar graph array constituted by L.E.D. diodes D10-D19. In this case the input voltage is constituted by the output of amplifier A1 which is proportional to the reflected power. The internal reference voltage VR1 is not used. Instead, the voltage divider ladder constituted by resistor R23-R30 receives a voltage VR3 which is proportional to the forward transmitted component. The voltage ladder in the latter case is designed to provide a series of logarithmically scaled reference points. This circuit can be implemented with a model 3915 large scale integration graph array driver module. A scale graduated directly in SWR units can be juxtaposed to the logarithmic bar graph array for convenient interpretation of the readout.

Since the referenced voltage VR3 is variable and proportional to the forward transmitted component of the power, one may conceive that such voltage could fall below the minimum value of the output of amplifier A1 which corresponds to the reflected component of the power. This would result in some erroneous display on the bar graph array D10-19. A minimum threshold circuit built around amplifier A3 resolves this problem. The positive input of the amplifier is referenced by way of voltage divider R16 and R17 to a point near the minimum value of the output of amplifier A1. Diode D6 is back-biased whenever the voltage applied to the negative terminal input of the amplifier A3 exceeds the minimum threshold.

Two supply voltages are necessary to the operation of the described circuit: a +3.5 volt applied to resistor R17 to establish the minimum threshold voltage, and a general supply voltage of +15 volts. These voltages are provided by the power supply constituted by transformer T2 and associated components.

While I have described the preferred embodiment of the invention, modifications can be made thereto and other embodiments may be devised without departing from the spirit of the invention and the scope of the appended claims.

What is claimed is:

1. An apparatus for measuring the standing wave ratio of a signal on a transmission line between a radio frequency signal source and its load which comprises:

means for generating a first DC voltage signal proportional to the amplitude of the incident component of the transmitted power;
   means for generating a second DC voltage signal proportional to the amplitude of the reflected component of the transmitted power;
   means for indicating in discreet increments the relative amplitude of the second DC voltage signal in relation to the amplitude of the first DC voltage signal;
   said means for indicating comprising:
      a stack of voltage comparators, each of said comparators having an input receiving the second DC voltage signal;
      a voltage divider chain to which is applied the first DC voltage signal;
      said voltage divider chain providing a series of scaled reference points individually connected to the reference inputs of said comparators; and
      means for displaying the output status of each of said voltage comparators.

2. The apparatus claimed in claim 1 which further comprises means for preventing the amplitude of the first DC voltage signal applied to the voltage divider chain from falling below the level of minimum amplitude of the second DC voltage signal.

3. The apparatus claimed in claim 2 wherein said divider chain provides reference points scaled in a logarithmic progression.

4. The apparatus claimed in claim 3 which further comprises means for indicating, in discreetly scaled increments, the absolute amplitude of the first DC voltage signal.

5. The apparatus claimed in claim 4 wherein said means for indicating the absolute amplitude comprises:
   a second series of voltage comparators, each having an input receiving the first DC voltage signal;
   a second voltage divider chain to which is applied a voltage commensurate with the full scale excursion of the first DC voltage signal;
   said second voltage divider chain providing a series of scales reference points individually connected to the reference inputs of the second series of voltage comparators; and
   means for displaying the output status of the second series of voltage comparators.

6. The apparatus claimed in claim 2 wherein said means for generating comprises:
   a transformer having a primary winding connected in series with the transmission line and a secondary winding having a first-end terminal, a second-end terminal, and central-tap terminal;
   a first positive rectifying circuit connected to said first-end terminal;
   a second positive rectifying circuit connected to said second-end terminal; and
   an adjustable capacitive divider circuit fed by the transmission line and having a central node connected to said central-tap terminal.

7. The apparatus claimed in claim 6 wherein said means for generating comprises:
   a first adjustable amplifier receiving the output of the first positive rectifying circuit; and
   a second adjustable amplifier receiving the output of the second positive rectifying circuit.

8. The apparatus claimed in claim 2 wherein said means for preventing comprises:

an operational amplifier having its positive input biased to a near-zero positive reference point;

a feedback loop comprising a diode having its anode connected to the output and its cathode connected to the negative input terminal of the operational amplifier; and said negative input also receiving said first DC voltage signal through a resistive path.

9. The apparatus claimed in claim 5 which comprises at least one monolithic integrated module of bar graph array drivers.

10. The apparatus claimed in claim 9 wherein said module comprises a series of scaled thresholds associated with said drivers.

* * * * *